United States Patent [19]

Chao et al.

[11] Patent Number: 5,291,078
[45] Date of Patent: Mar. 1, 1994

[54] GATE CIRCUITS IN TRANSITION DETECTION INPUT BUFFERS

[75] Inventors: Chai-Chin Chao, Plano; Edison H. Chiu, Richardson, both of Tex.

[73] Assignee: Texas Instruments Incorporated, Dallas, Tex.

[21] Appl. No.: 83,397

[22] Filed: Jun. 28, 1993

Related U.S. Application Data

[63] Continuation of Ser. No. 994,190, Dec. 21, 1992, abandoned, which is a continuation of Ser. No. 676,996, Mar. 28, 1991, abandoned.

[51] Int. Cl.[5] .................................... H03K 19/20
[52] U.S. Cl. ................................. 307/451; 307/481
[58] Field of Search ............... 307/451, 443, 360, 290, 307/481

[56] References Cited

U.S. PATENT DOCUMENTS

| | | | |
|---|---|---|---|
| 4,464,587 | 8/1984 | Suzuki et al. | 307/290 |
| 4,687,954 | 8/1987 | Yasuda et al. | 307/290 |
| 4,939,394 | 7/1990 | Hashimoto | 307/290 |

*Primary Examiner*—Robert J. Pascal
*Assistant Examiner*—Tan Dinh
*Attorney, Agent, or Firm*—John D. Crane; Richard L. Donaldson; Stanton C. Braden

[57] ABSTRACT

A NAND gate circuit system that provides for adjustable pulse width that comprises eight transistors arranged so that a signal can propagate through the transistors in series, the transistors consisting of at least one N-channel and at least one P-channel transistor.

3 Claims, 12 Drawing Sheets

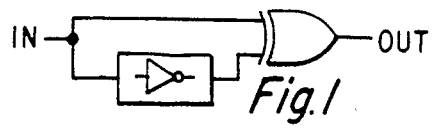
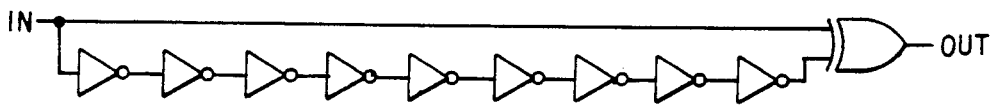
Fig.2 PRIOR ART
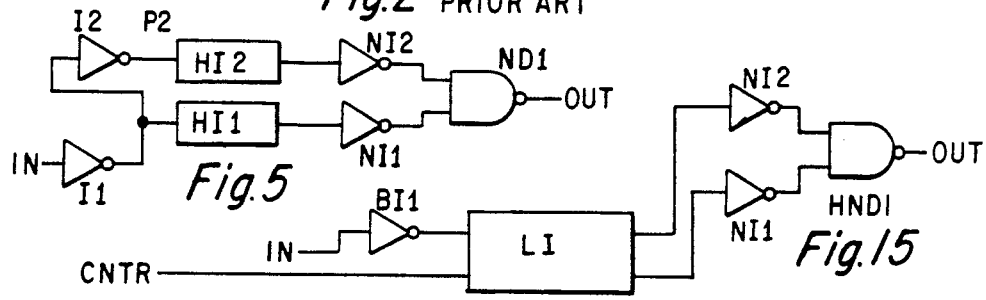
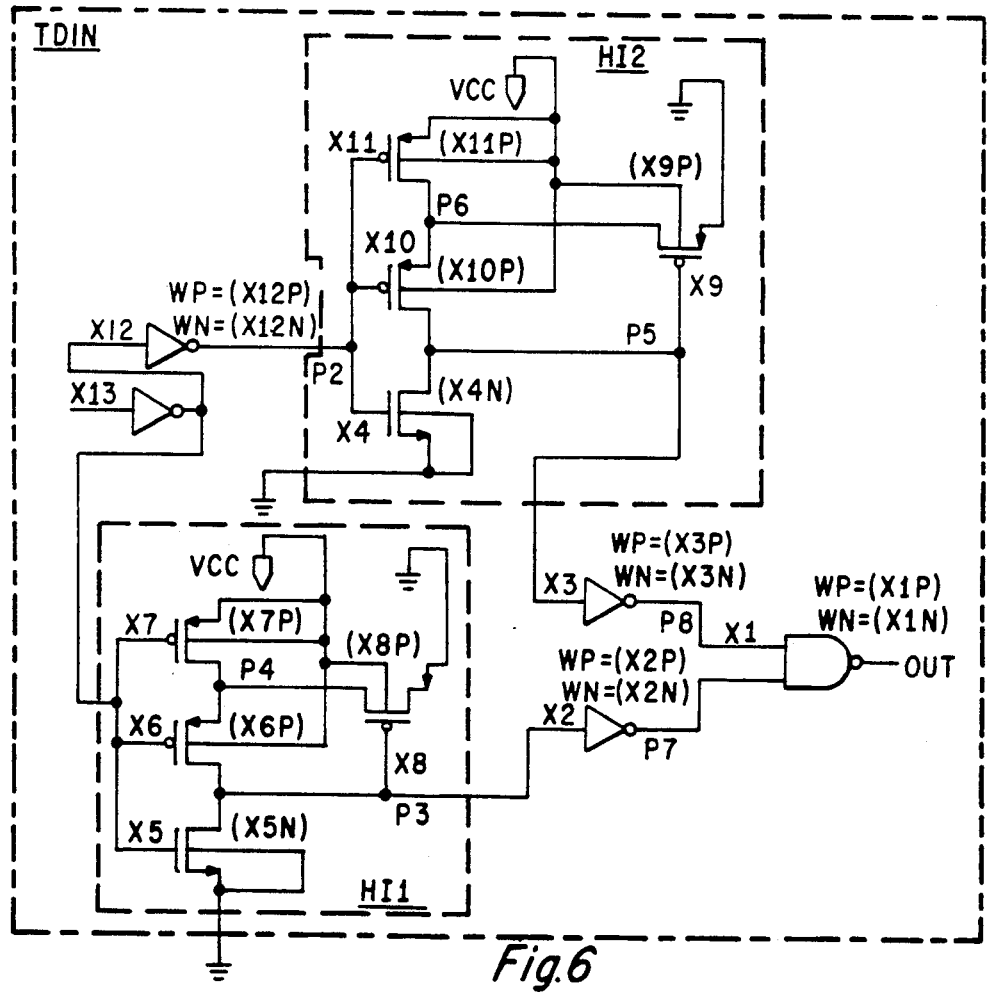

GATE CIRCUITS IN TRANSITION DETECTION INPUT BUFFERS

This application is a continuation of application Ser. No. 07/994,190, filed on Dec. 21, 1992 and now abandoned, entitled Gate Circuits In Transition Detection Input Buffers, which is a continuation application under 37 C.F.R. §1.62 07/676,996, filed on Mar. 28, 1991 and now abandoned, entitled Transition Detection Input Buffer.

BACKGROUND OF THE INVENTION

The present invention relates generally to address and data transition detection. This technique is commonly used to reduce power consumption, especially in Static Random Access Memory devices (SRAM).

Conventional transition detection circuits generally consist of an exclusive OR gate and multiple inverters (See FIG. 1 and 2 for circuit diagrams). One input terminal of the exclusive OR gate is connected directly to the input line. The other input terminal is connected to the output of a series of inverters connected together. This series of inverters is positioned between the input line and the second input terminal to the exclusive OR gate. When the address or data input changes, the exclusive-OR gate generates a pulse whose width equals the delay caused by the series of inverters (See FIG. 3 for the timing diagram of the circuit of the circuit diagram of FIG. 2, which was provided by the SPICE simulation program).

These conventional transition detection circuits have several disadvantages. In particular, the parameters of the transition boundaries of the pulse are inconsistent, as the pulse width is non-adjustable and the pulse is extremely sensitive to noise. The width of the pulse, the slope of the transitional boundaries of the pulse, and the circuit's immunity to noise ultimately affect the speed of the extended circuit.

Regarding the adjustable pulse width, the number of additional inverters in series can be changed to adjust the pulse width. These adjustments generally occur in multiples of two, in order to maintain the proper polarity. The total number of inverters is generally an odd number. (FIG. 1 and 2 demonstrates the variable lengths of these inverter chains. FIG. 1 has one inverter in series. FIG. 2 has nine inverters in series.) Regarding the transitional boundaries, the slope of the transitional boundaries is small, which slows down the operation of the entire system. Regarding the sensitivity of these traditional circuits to noise, changes in the IN signal translates to direct changes in the OUT signal. If the IN signal is noisy, the OUT signal is noisy as well. These traditional circuits tend to be extremely sensitive to noisy inputs (See FIG. 4 for a for the timing diagram for the circuit diagram presented in FIG. 2 for a noisy input signal, which is provided by the SPICE simulation of the circuit).

BRIEF DESCRIPTION OF THE DRAWINGS

Further features and advantages will become apparent from the following and more particular description of the various embodiments of the invention, as illustrated in the accompanying drawings, wherein:

FIG. 1 is a prior art transition detection circuit.

FIG. 2 is a the circuit diagram of FIG. 1 with the additional inverters added to provide for an adjustable pulse width, which is provided by SPICE simulation of the circuit.

FIG. 5 is a block diagram of the preferred embodiment of the transition detection input buffer.

FIG. 6 is the circuit diagram of the preferred embodiment shown in FIG. 5.

FIG. 15 is a block diagram of an alternate embodiment of the transition detection input buffer with input latch control.

DETAILED DESCRIPTION OF THE PREFERRED EMBODIMENTS

Figure 3:
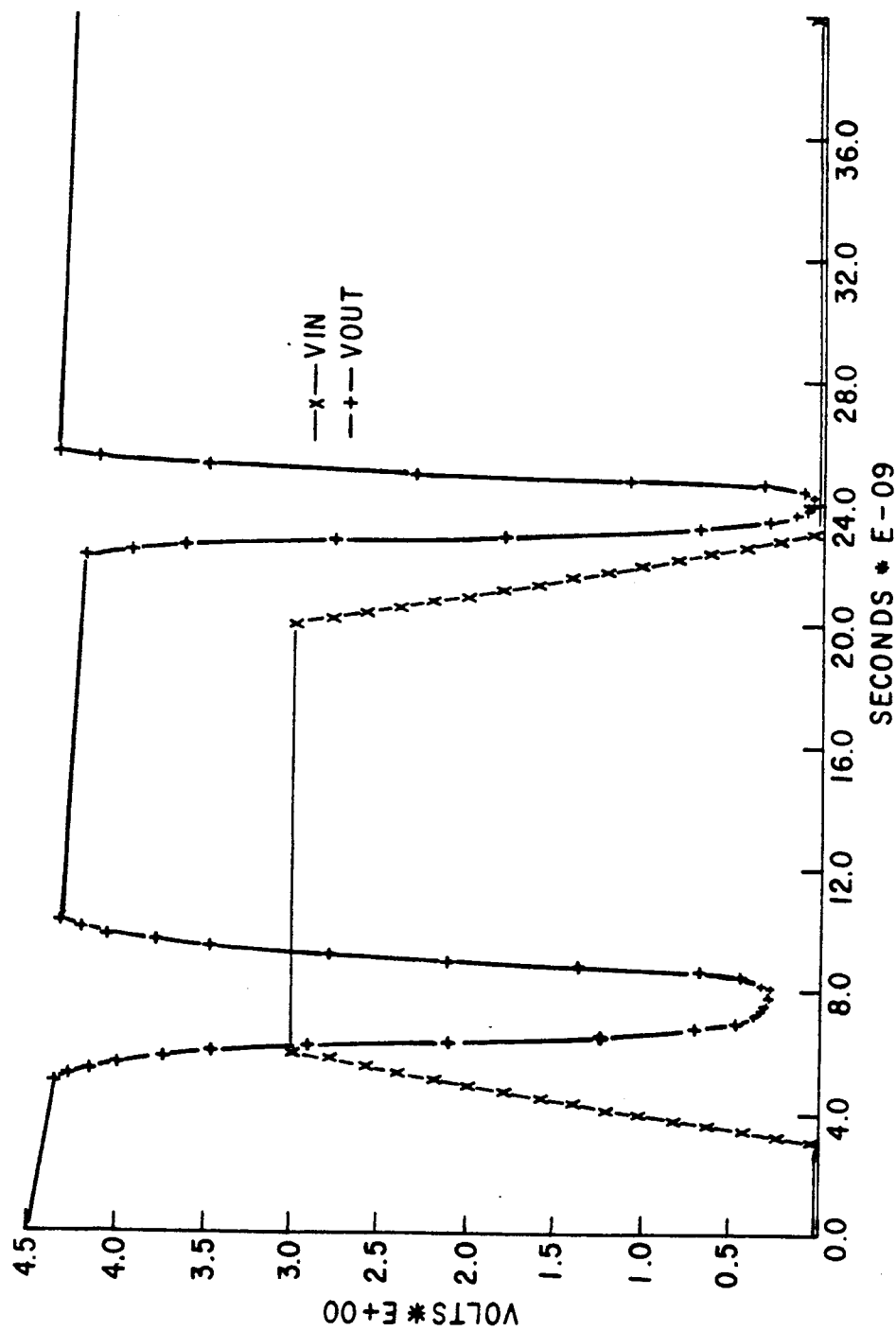
FIG. 3 is a timing diagram for the circuit shown in FIG. 2, which is typical of circuits of this type, which is provided by the SPICE simulation of the circuit.
Figure 4:
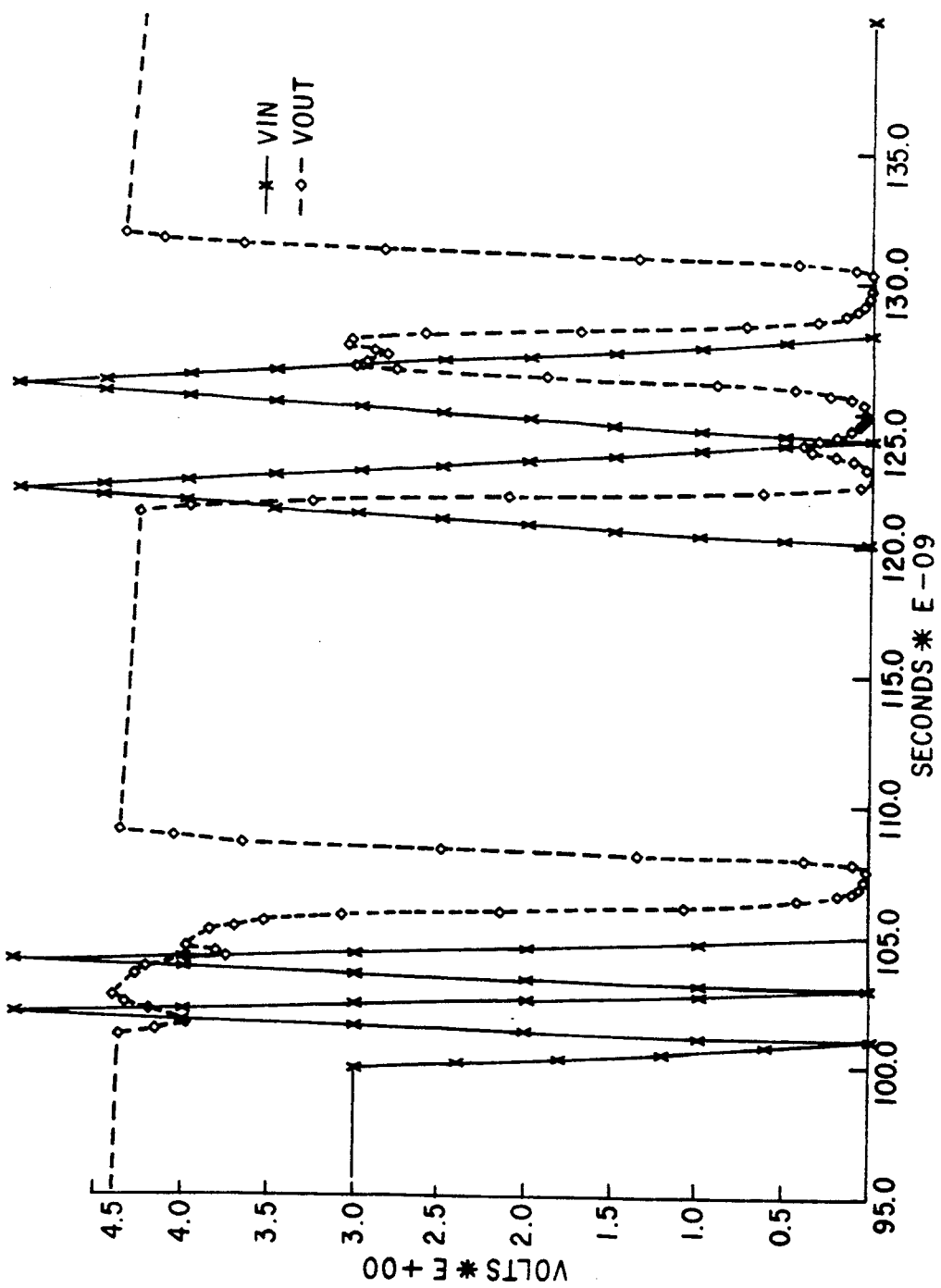
FIG. 4 is a timing diagram of the circuit shown in FIG. 2, which shows the effects of noise on circuits of this type, which is provided by the SPICE simulation of the circuit.

FIG. 5 is a functional block diagram of the preferred embodiment of the transition detection input buffer. The input IN of the circuit enters a first inverter I1, which acts as a buffer. The output of the first inverter I1 enters the input terminal of a second inverter I2, which provide complementary signal of P1. The output of the first inverter I1 also enters the first one way hysteresis inverter HI1. Likewise, the output of the second inverter I2 also enters a second one way hysteresis inverter HI2. The one way hysteresis inverters HI1 and HI2 reduce the effects of noise on the output of the circuit. The output of the first one way hysteresis inverter HI1 enters invertor NI1. The output of the second one way hysteresis inverter HI2 enters NI2. Inverters NI1 and NI2 have multiple NMOS transistors in series and provide an adjustable pulse width. The output of invertor NI1 enters one terminal of a two input NAND gate ND1. The output of inverter NI2 enters the other terminal of a two input NAND gate ND1. The output of the two input NAND gate is the output OUT of the circuit.

FIG. 6 is a circuit diagram of the preferred embodiment of the transition detection input buffer. The input signal enters the circuit via terminal A. The inverter X13, which is connected to terminal A and node P1, inverts the input signal and acts as a buffer. The input terminal of the inverter X12 and the input terminal of the first one way hysteresis inverter circuit HI1 are also connected to node P1. The output of the Inverter X12 is connected to the input terminal of a second one way hysteresis inverter circuit. These one way hysteresis inverter circuits reduce the overall circuit's sensitivity to noise, as they smooth out the rising edge of the output pulse.

The first one way hysteresis invertor circuit HI1 is connected between nodes P1 and P3 and is comprised of four complementary MOS FETs X5N, X6P, X7P, and X8P. FET X5N is an N-channel transistor and X6P, X7P, and X8P are P-channel transistors. The gate electrode of N-channel transistor X5N is connected to the gate electrodes of transistors X6P and X7P and to the output of the inverter X13 at node P1. The source and substrate terminals of transistor X5N are connected to the supply voltage GND*G. The drain of the transistor X5N is connected to the drain of the transistor X6P and the gate of transistor X8P at node P3. The source of transistor X6P is connected to the drain of P-channel transistor X7P and the drain of transistor X8P. The substrate terminals of the transistors X6P, X7P, and X8P are connected to supply voltage VCC*G. The source electrode of X7P transistor is connected to the voltage supply voltage VCC*G. The source of transistor X8P is connected to the supply voltage GND*G.

The second one way hysteresis inverter circuit HI2 is connected between nodes P2 and P5 and is comprised of four complementary MOS FETs X4N, X9P, X10P, and X11P. FET X4N is an N-channel transistor and X9P, X10P, and X11P are P-channel transistors. The gate electrode of the transistor X4N is connected to the gate electrodes of the transistors X10P and X11P and to the output of the invertor X12 at node P2. The source and substrate terminals of transistor X4N are connected to the supply voltage GND*G. The drain of the transistor X4N is connected to the drain of transistor X10P and to the gate of transistor X9P at node P5. The source of transistor X10P is connected to the drain of transistor X11P and the drain of transistor X9P. The substrate terminals of transistors X9P, X10P, and X11P are connected to supply voltage VCC*G. The source electrode of the X11P transistor is connected to the voltage supply VCC*G as well. The source of transistor X9P is connected to the supply voltage GND*G.

The output of the first one way hystersis inverter circuit HI1 is connected to the input terminal of a first inverter X2 at node P3. Inverter X2 is connected between nodes P3 and P7. The output of one way hystersis invertor circuit HI2 is connected to the second inverter X3. The second inverter X3 is connected between nodes P5 and P8. Inverters X2 and X3 provide for an adjustable pulse width as described below.

Figure 7:
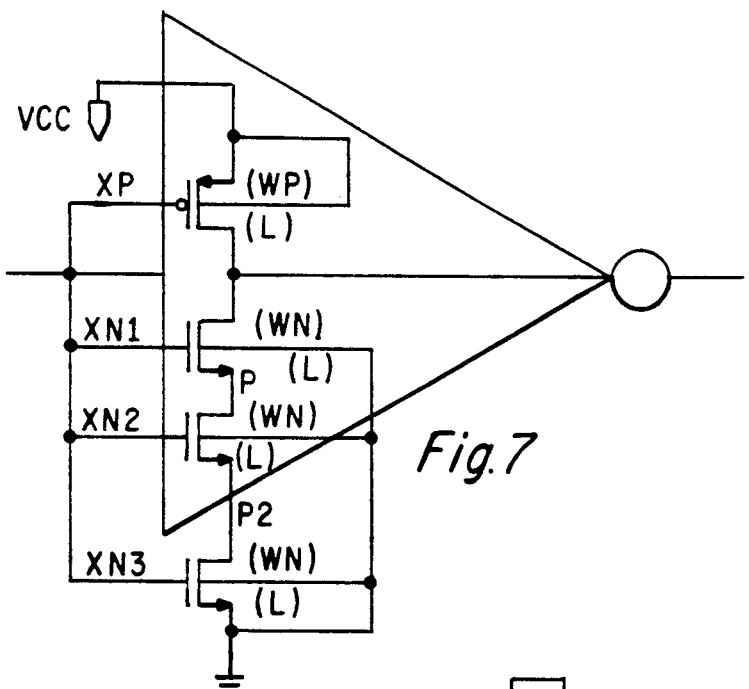
FIG. 7 is an enlarged diagram of an inverter with multiple NMOS in series, which is used in the transition detection input buffer illustrated in FIG. 6.

An enlarged diagram of inverters X2 and X3 is shown in FIG. 7. As shown in FIG. 7, the input to the inverter is connected to the inverted gate of P-channel transistor XP and the gates of three series connected N-channel transistors XN1, XN2, and XN3. The substrate terminals of transistors XN1, XN2, and XN3 are connected to the supply voltage GND*G. The source terminal and the substrate terminal of transistor XP are connected to supply voltage VCC*G. The drain terminal of transistor XP is connected to the drain of transistor XN1 and to the output terminal of the invertor. The source of the transistor XN1 is connected to the drain of the transistor XN2. The source of the transistor XN2 is connected to the drain of transistor XN3. The source of transistor XN3 is connected to the supply voltage GND*G. Additional NMOS transistors can be included in series as well, which introduce additional time delays in the system, and, thus, provide for an adjustable pulse width. It is possible to layout several NMOS transistors in advance without actually using all of them at any one time. The actual number used depends upon the width of the desired pulse.

Referring again to FIG. 6, the outputs of inverters X2 and X3 connect to a two input NAND gate X1 at nodes P7 and P8 respectively. The output of NAND gate X1 is the output terminal OUT of the entire circuit.

Figure 8:
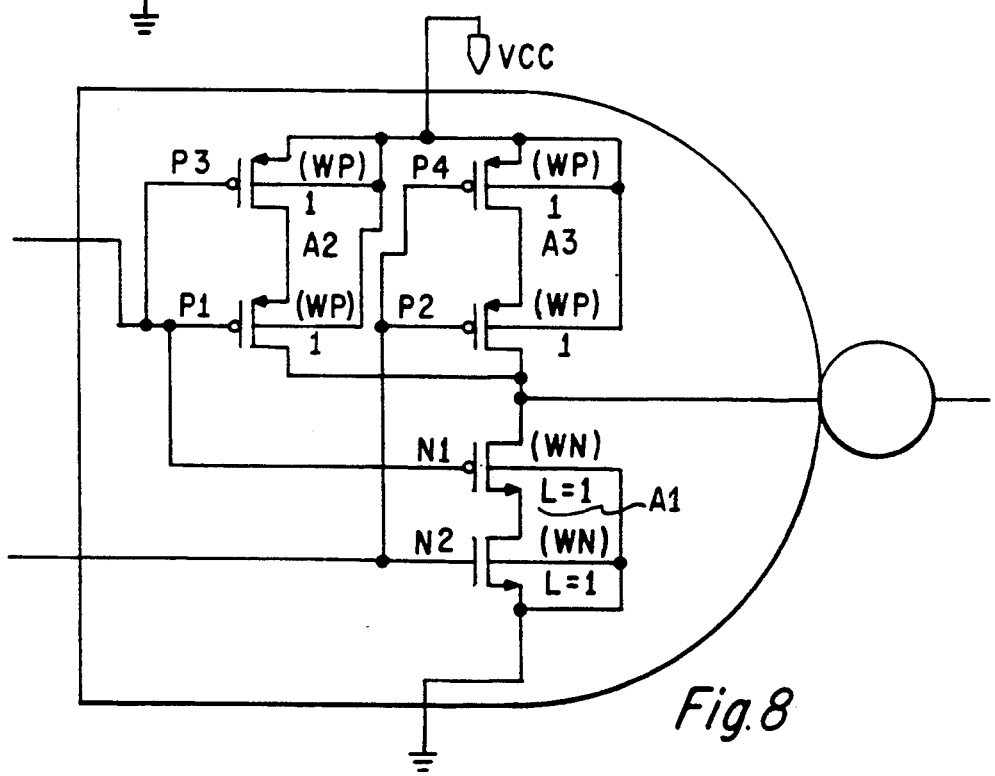
FIG. 8 is an enlarged diagram of a two input NAND gate used in the transition detection input buffer illustrated in FIG. 6.

FIG. 8 shows an enlarged circuit diagram of two input NAND gate X1. As shown in FIG. 8, the two input NAND gate X1 of FIG. 6 comprises P-channel transistors P1, P2, P3, and P4 and N-channel transistors N1 and N2. A first input, shown as node P8 in FIG. 6, connects to the inverted gates of transistors P1 and P3 and the gate of transistor N1. The substrate terminals of P1 and P3 are connected to the supply voltage VCC*G, as are the substrate terminals of transistors P2 and P4. The source of transistor P3 is connected to the supply voltage VCC*G and the drain of transistor P3 is connected to the source of transistor P1. The drain of transistor P1 is connected to the drain of transistor P2, to the drain of transistor N1, and to the output of the NAND gate. A second input, shown as node P7 in FIG. 6, connects to the gate of transistor N2 and to the gates of transistors P2 and P4. The source of transistor N1 is connected to the drain of transistor N2. The source of transistor N2 is connected to the supply voltage GND*G, as are the substrate of transistors N1 and N2. The source of transistor P4 is connected to the supply voltage VCC*G. The drain of transistor P4 is connected to the source of the transistor P2.

Figure 8A:
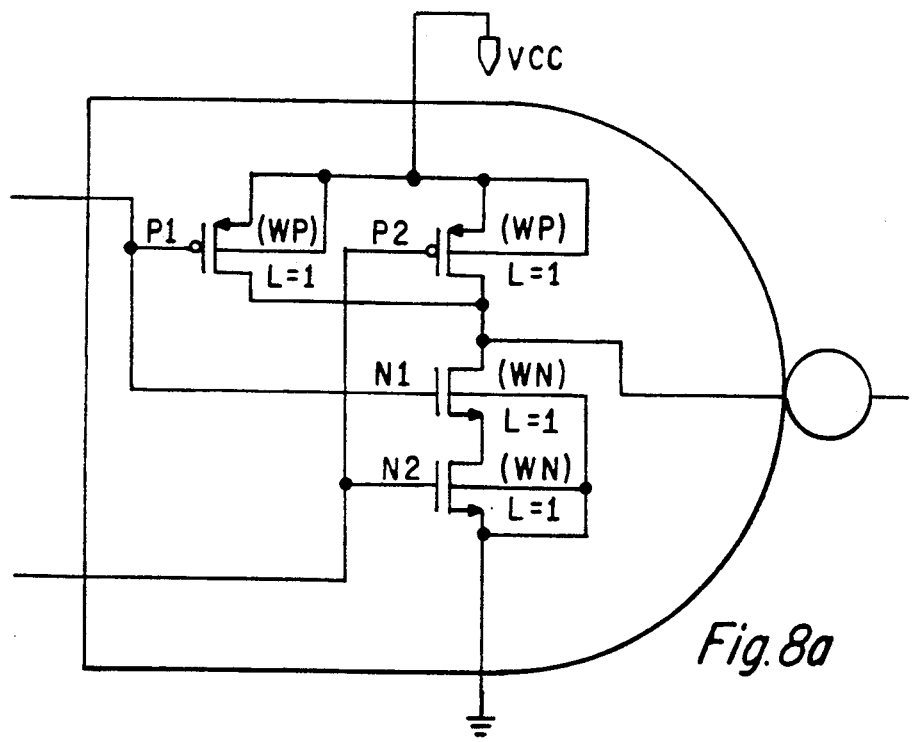
FIG. 8a is an enlarged diagram of a regular two input NAND gate, which could be used in place of the NAND gate used in the transition detection input buffer illustrated in FIG. 6.

The two input NAND gate of FIG. 8 could be replaced with a conventional NAND gate. FIG. 8a shows an enlarged circuit diagram of the preferred embodiment of the two input NAND gate circuit that could replace the NAND gate X1 shown in FIG. 6. The conventional NAND gate comprises P-channel transistors P1 and P2 and N-channel transistors N1 and N2. A first input connects to the gates of transistor P1 and the gate of transistor N1. The substrate of transistors P1 and P2 are connected to the supply voltage VCC*G. The source of transistors P1 and P2 are connected to the supply voltage VCC*G and the drain of transistors P1 and P2 are connected to the drain of transistor N1 and to the output of the NAND gate. A second input connects to the gate of transistor N2 and to the gate of transistor P2. The source of transistor N1 is connected to the drain of transistor N2. The source of transistor N2 is connected to the supply voltage GND*G. The substrate of transistors N1 and N2 are connected to the supply voltage GND*G.

Figure 9:
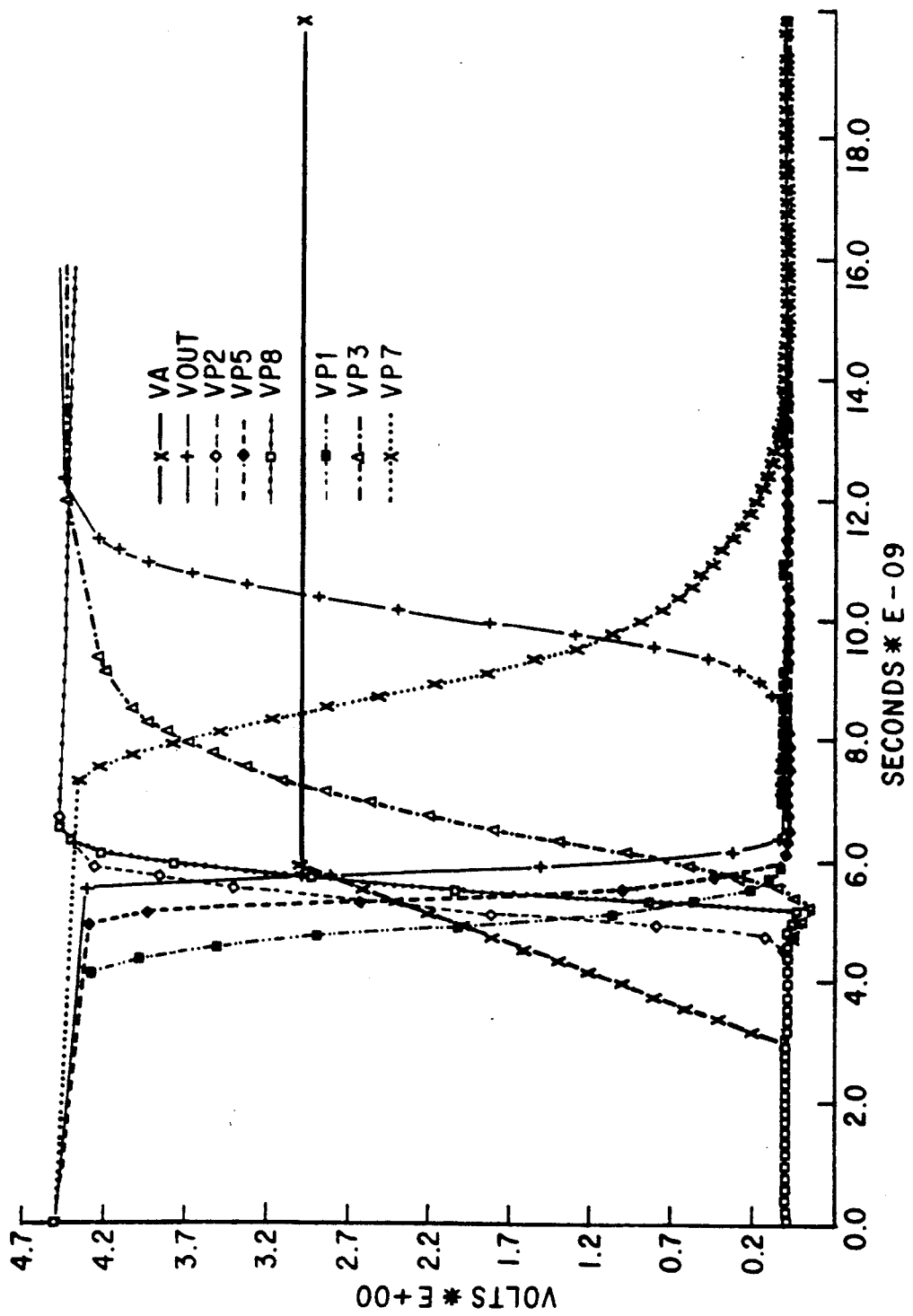
FIG. 9 is a timing diagram of the signals at P1, P2, P3, P5, P7, and P8 nodes, as compared to the corresponding rising edge of the input pulse signal and circuit output of the circuit diagram illustrated in FIG. 5 and 6, which is provided by the SPICE simulation program.

FIG. 9 is a timing diagram showing the signals at nodes P1, P2, P3, P5, P7, and P8, as compared to the corresponding rising edge of the input pulse signal VA and circuit output Vout of the circuit diagram illustrated in FIG. 6. P1 represents the signal at node P1, which is the output of inverter X13 (in FIG. 6). As the input pulse signal rises, the signal at node P1 drops rapidly after a short delay. P2 represents the signal at node P2, which is the output of inverter X12 (in FIG. 6). As the signal at node P1 drops, the signal at node P2 rises after a short delay. P3 represents the signal at node P3, which is the output of one way hystersis inverter HI1. The signal at node P3 rises slowly with a long delay after the input signal rises. P5 represents the signal at node P5, which is the output of hystersis inverter. The output of HI2 falls after a short delay from the rising input. P8 and P7 represent the signals at nodes P8 and P7 respectively. Node P8 is the output of inverter X3, which inverts the signal at the node P5 after a desired delay. Node P7 is the output of inverter X2, which inverts the signal at node P3 after a desired delay. Vout falls quite rapidly after the input VA rises and during the rise of VA and then rises again after a desired delay.

Figure 10:
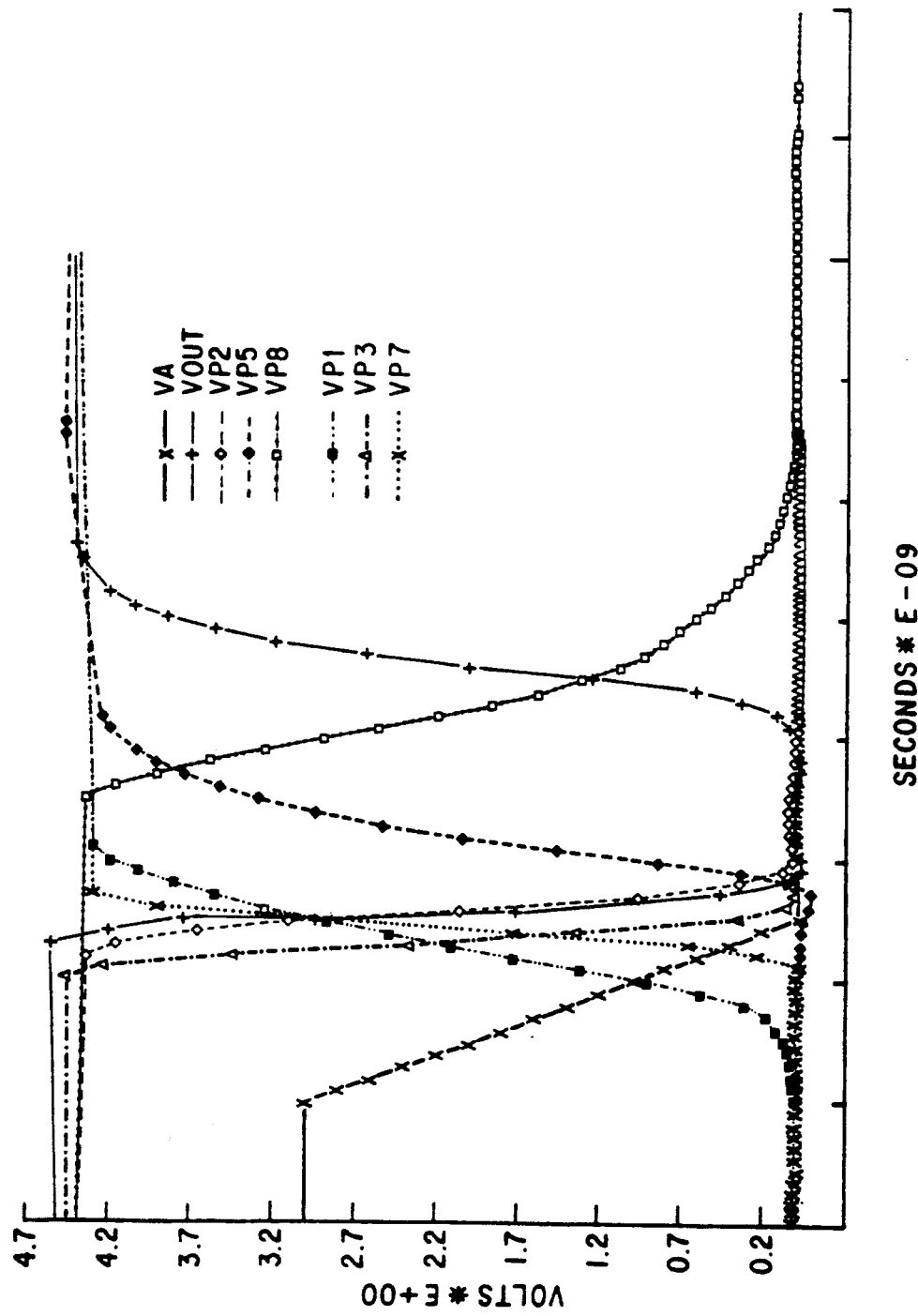
FIG. 10 is a timing diagram of the signals at P1, P2, P3, P5, P7, and P8 nodes, as compared to the corresponding falling edge of the input pulse signal and circuit output of the circuit diagram illustrated in FIG. 5 and 6, which is provided by the SPICE simulation program.

FIG. 10 is a timing diagram showing the signals at nodes P1, P2, P3, P5, P7, and P8, as compared to the corresponding falling edge of the input pulse signal and circuit output of the circuit diagram illustrated in FIG. 6. P1 represents the signal at node P1, which is the output of inverter X13 (in FIG. 6). As the input pulse signal falls, the signal at node P1 signal rises rapidly after a short delay. P2 represents the signal at node P2, which is the output of inverter X12 (in FIG. 6). As the signal at node P1 rises, it drops to its bottom level after a short delay. P3 represents the signal at node P3, which is positioned after the output of one way hystersis invertor circuit HI1. The signal at node P3 falls sharply with a short delay after the input signal falls. P5 represents the signal at terminal P5, which is positioned after the second one way hystersis invertor circuit HI2 (in FIG. 6). The signal at node P5 rises slowly after a long delay from the falling input. P8 and P7 represent the signals at nodes P8 and P7 respectively. Node P8 is the output of inverter X3, which inverts the the signal at node P5 after a desired delay. Node P7 is the output of inverter X2, which inverts the signal at the node P3 after a desired delay. Vout drops quite rapidly after the input VA drops and during the fall of VA and then rises again after a desired delay.

Figure 11:
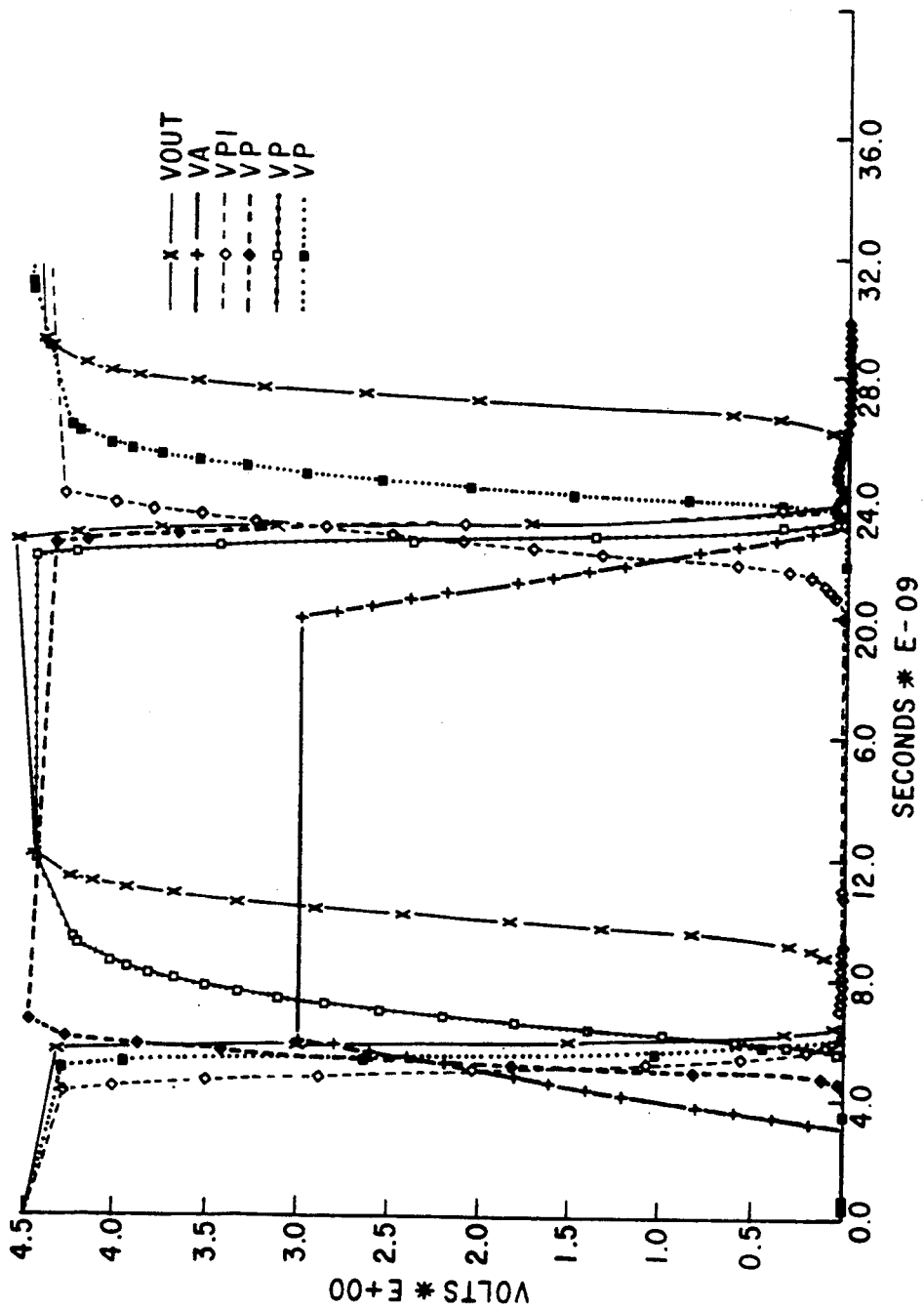
FIG. 11 is a timing diagram of the signals at P1, P2, P3, P5, P7, P8, input pulse signal, and corresponding circuit output nodes for both the rising and falling edges of an input pulse signal, thereby incorporating FIG. 9 and FIG. 10.

FIG. 11 is a timing diagram of the signals at P1, P2, P3, P5, input pulse signal, and corresponding circuit output nodes for both the rising and falling edges of an input pulse signal, thereby incorporating FIG. 9 and FIG. 10.

Figure 12:
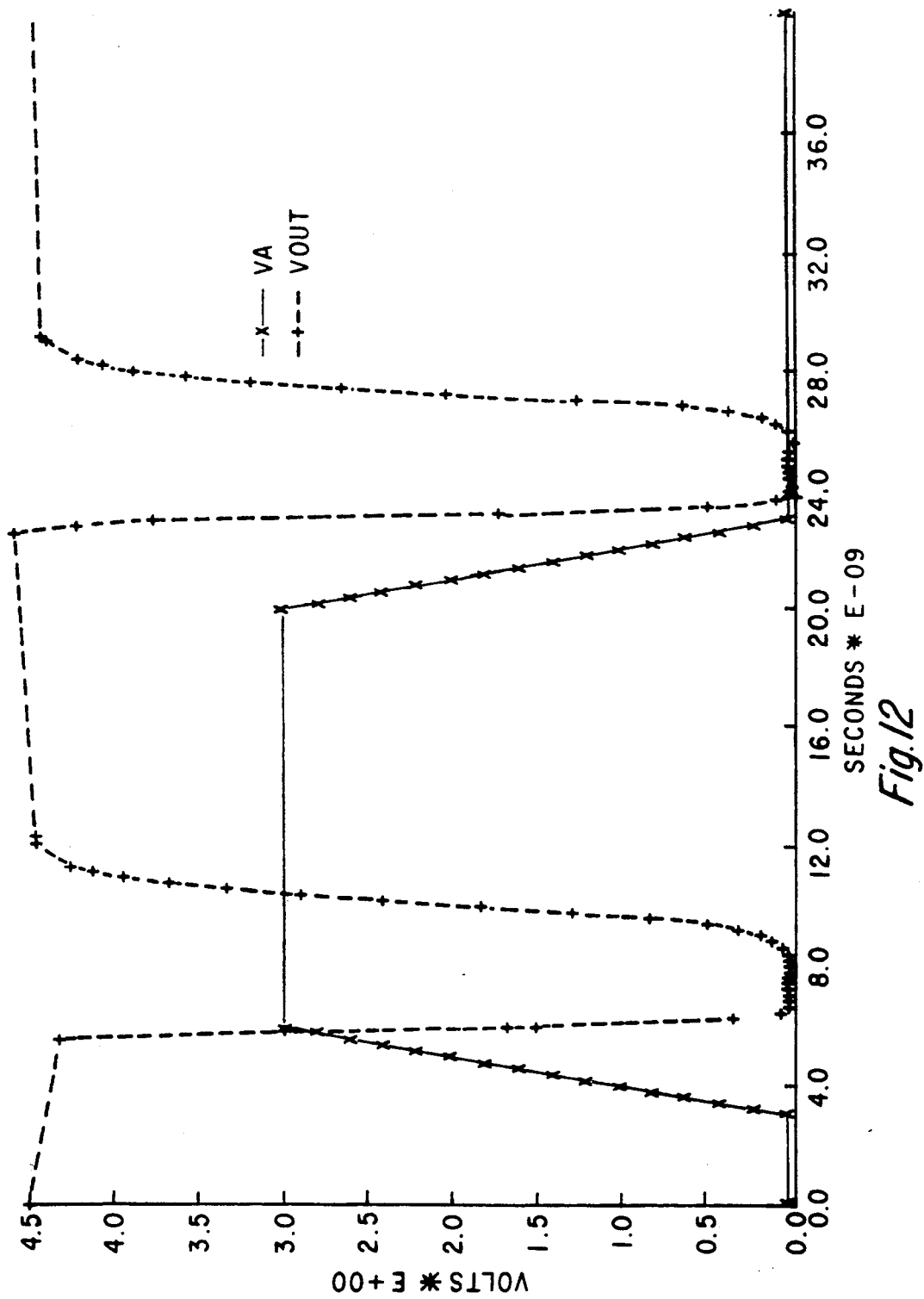
FIG. 12 is a timing diagram of the signals of the input pulse signal and corresponding output of the circuit diagram illustrated in FIG. 5 and 6, which is provided by the SPICE simulation program.

FIG. 12 is a timing diagram signal comparing input signal VA and the corresponding output signal Vout of the transition detection input buffer circuit of FIG. 6. Note the disclosed circuit produces a Vout signal with a sharp falling edge and the sharp rising edge, which maximizes the available pulse width of the circuit.

Figure 13:
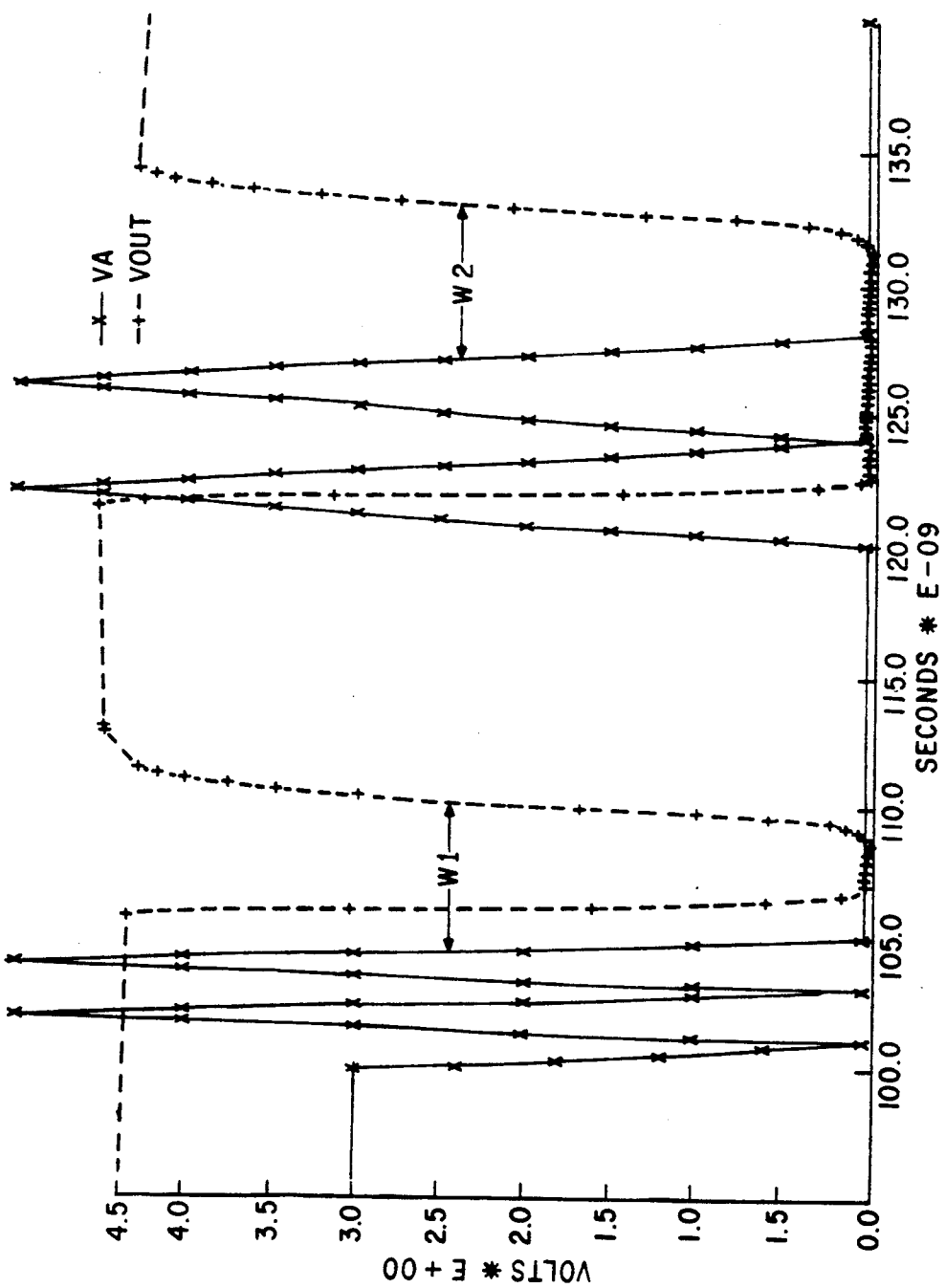
FIG. 13 is a timing diagram of the signals for a noisy input pulse signal and corresponding output of the circuit diagram illustrated in FIG. 5 and 6, which is provided by the SPICE simulation program.

FIG. 13 is a timing diagram comparing an extremely noisy input signal pulse VA and corresponding output Vout of the transition detection input buffer circuit diagram illustrated in FIG. 6. As shown the voltage output Vout is immune to this extremely noisy input VA, as can be seen by comparing FIGS. 12 and 13. The circuit provides the noise immunity and provided a desired pulse after the input VA stable. It means after the input VA stable to the rising edge of VOUT is constant $W1 \approx W2$ in FIG. 13.

Figure 14:
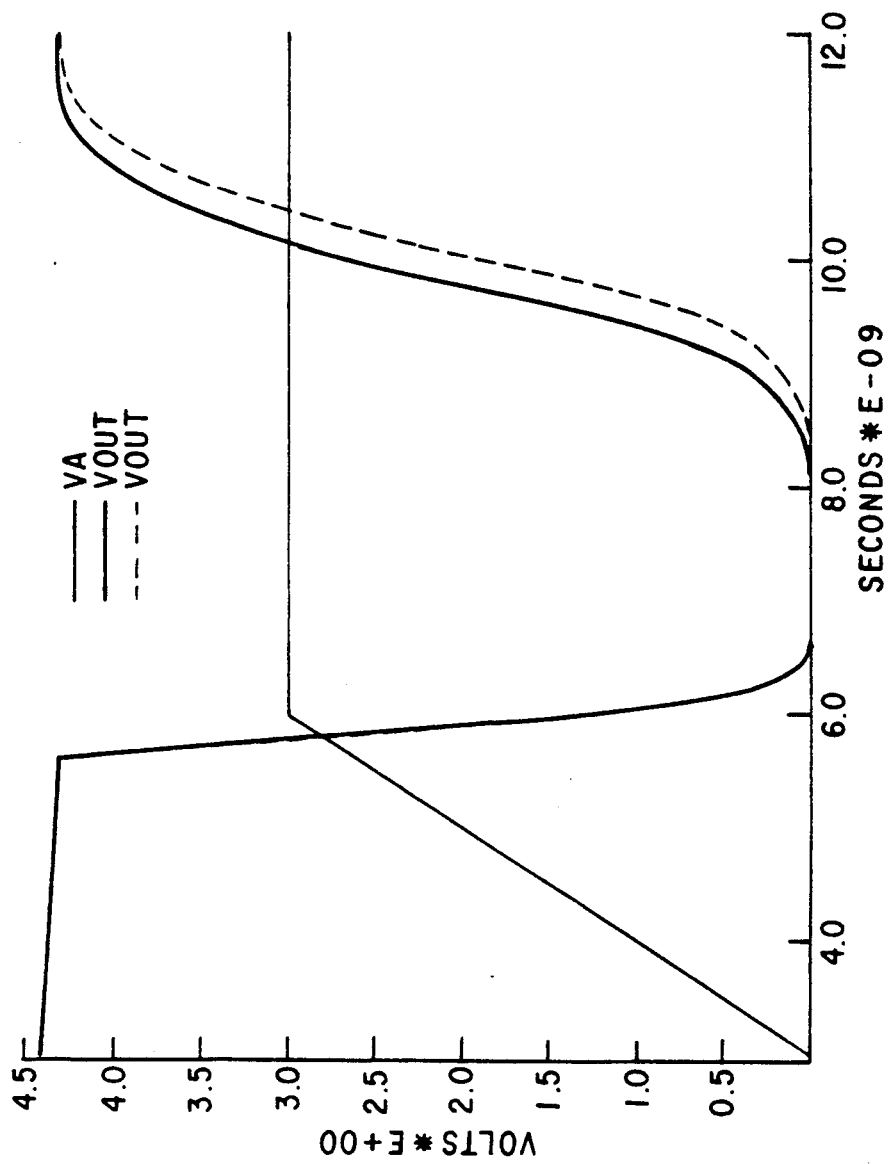
FIG. 14 is a timing diagram of the signals for the input pulse signal and a adjustable corresponding output of the circuit diagram illustrated in FIG. 5 and 6, which is provided by the SPICE simulation program.

FIG. 14 is a timing diagram comparing the input signal VA and the respective output signal, which is represented by Vout 1 or Vout 2, of the alternative embodiment of the transition detection input buffer circuit illustrated in FIG. 6. As shown the transition output pulse, which is represented by Vout 1 and Vout 2, is adjustable. By connected more NMOS in series for the inverter X2 and X3.

FIG. 15 is a functional diagram of the preferred embodiment of the transition detection input buffer with input latch control. The input IN of the circuit enters the invertor BI1, which acts as an buffer. The output of the invertor BI1 enters one input of the latch circuit LI. A control input CNTR enters another input of the latch circuit LI to control the input latch. The first output of the latch circuit LI enters a the inverter NI1. The second output of the latch circuit enters the inverter NI2. These inverters NI1 and NI2 provide for an adjustable pulse width. The output of inverter NI1 enters one terminal of a one way hysteresis two input NAND gate HND1. The output of the inverter NI2 enters the other terminal of a one way hysteresis two input NAND gate HND1. The output of the two input NAND gate HND1 is the output of the circuit.

Figure 18:
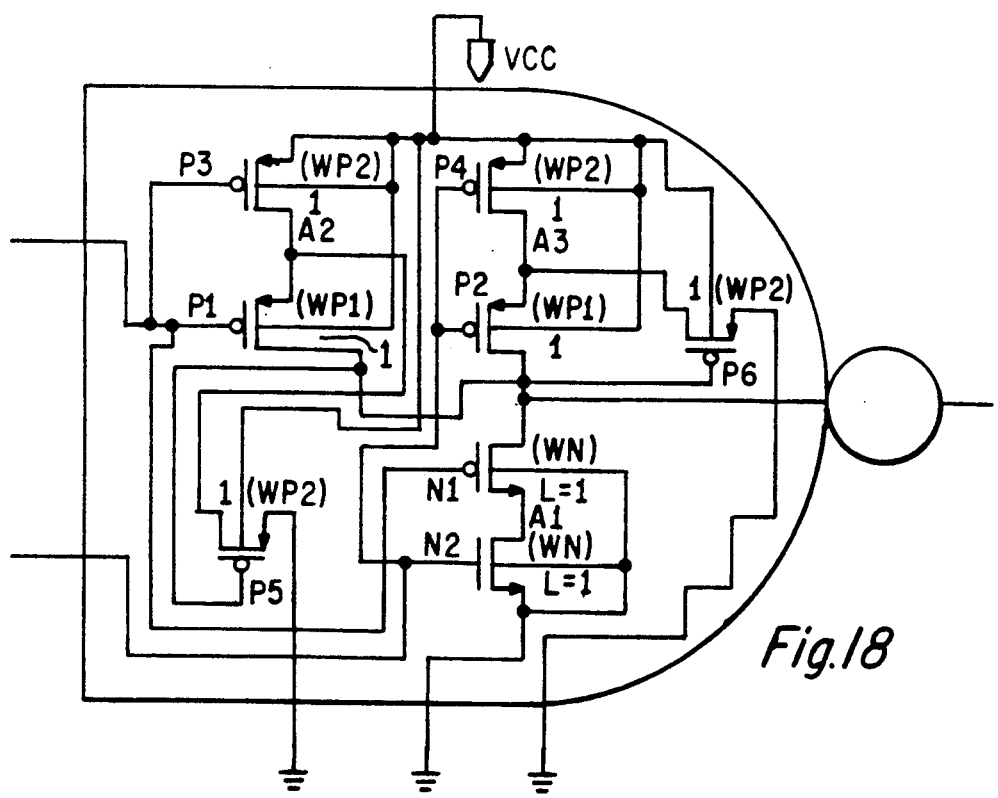
FIG. 18 is an enlarged diagram of the one way hysteresis, two input NAND gate used in the transition detection input buffer with input latch control illustrated in FIG. 16.
Figure 16:
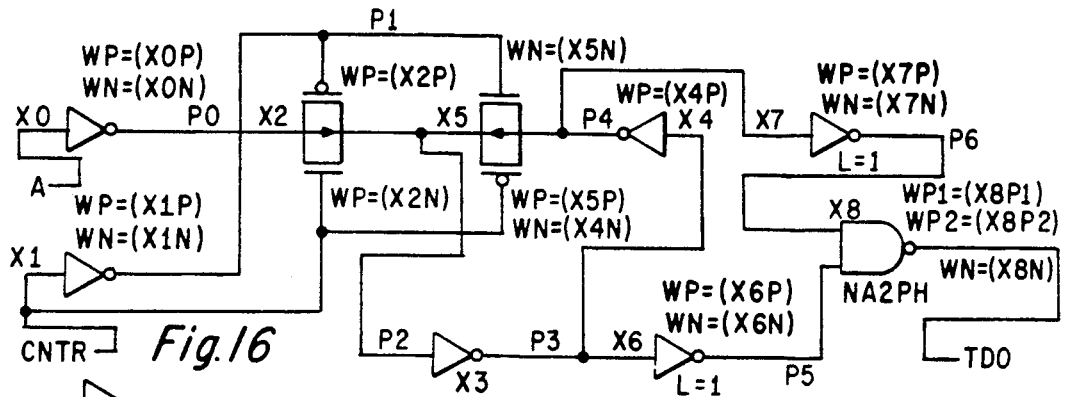
FIG. 16 is the circuit diagram of an alternate embodiment of the transition detection input buffer with input latch control.
Figure 17:
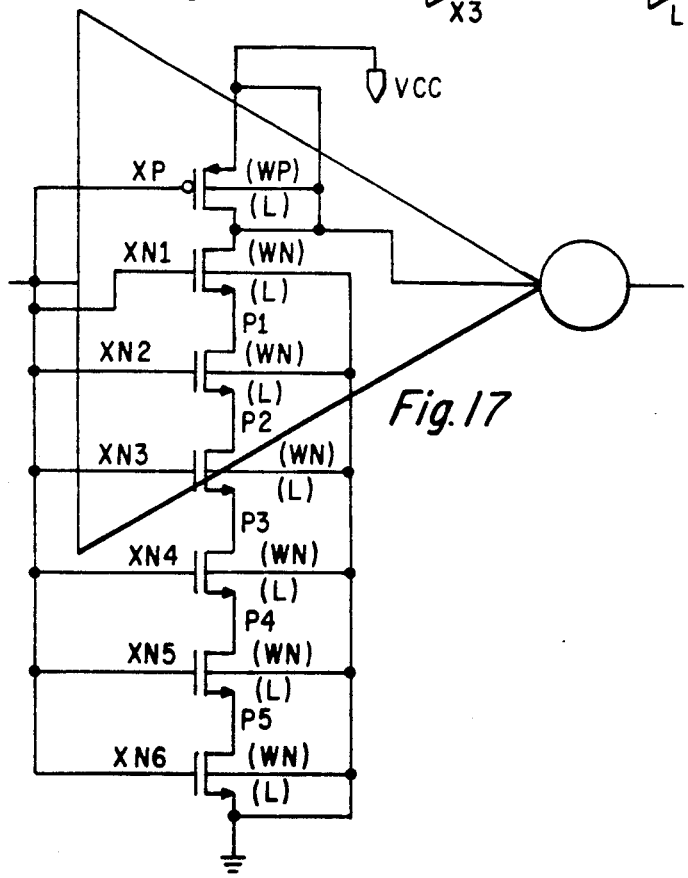
FIG. 17 is an enlarged diagram of the one way delay invertor used in the transition detection input buffer with input latch control illustrated in FIG. 16.

FIG. 16 is a circuit diagram of the preferred embodiement of the transition detection input buffer with input latch control. The input signal enters the input of the inverter X0, which acts as a buffer. The output of the inverter X0 enters the latch component of the circuit via node P0. The control signal enters the latch component of the circuit via the node CNTR. Components X1, X2, X3, X4, and X5 form a latch circuit to latch data when CNTR is low and to input data when CNTR is high. The node CNTR connects the NMOS gate terminal of the transmission gate X2 and the PMOS gate terminal of the transmission gate X5 to the input terminal of the inverter X1, which inverts the signal CNTR. The output of the inverter X1 connects to the node P1 and the PMOS gate terminal of the transmission gate X2 and the NMOS gate terminal of the transmission gate X5. The node P0 is connected to the input to a transmission gate X2. Node P2 connects to the output of transmission gate X2 and to the output terminal of the transmission gate X5 and to input terminal of the inverter X3. The node P3 is connected to the output of the inverter X3 and the input terminal of the invertor X4 and to the input terminal of the inverter X6, which has one PMOS transistor and multitude of NMOS transistors connected in series. The node P4 connects the output of the transistor X4 is connected to the terminal P4 to the input terminal of the transmission gate X5 to the input terminal of the inverter X7, which has one PMOS transistor and multitude of NMOS transistors connected in series. Node P5 connects the output of the inverter X6 is to the the first input of the one way hysteresis two input NAND gate X8 and the the node P6 connects the output of the inverter X7 to the second input of the one way hysteresis two input NAND gate X8. FIG. 17 is an enlarged diagram of the inverter X6 and X7. The output of this NAND gate X8 is connected to the output terminal of the circuit. This one way hysteresis two input NAND gate X8 reduces the circuit's sensitivity to noise, especially to small amplitude, high frequency noise, without a significant reduction in transition detection speed. FIG. 18 is an enlarged diagram of the two input NAND gate with one hysteresis used in the transition detection input buffer with input latch control illustrated in FIG. 16.

Referring now to FIG. 17, it shows the input to the inverters X6 and X7 connected to the inverted gate of P-channel transistor XP and the gates of six N-channel transistors XN1, XN2, XN3, XN4, XN5 and XN6. The substrate terminals of transistors XN1, XN2, XN3, XN4, XN5 and XN6 are connected to the supply voltage GND*G. The source terminal and the substrate terminal of transistor XP is connected to supply voltage VCC*G. The drain terminal of transistor XP is connected to the drain of transistor XN1 and to the output terminal of the invertor. The source of the transistor XN1 is connected to the drain of the transistor XN2. The source of the inverter XN2 is connected to the drain of transistor XN3. The source of the inverter XN3 is connected to the drain of transistor XN4. The source of the invertor XN4 is connected to the drain of transistor XN5. The source of the inverter XN5 is connected to the drain of transistor XN6. The source of invertor XN6 is connected to the supply voltage GND*G. Additional NMOS transistors can be included in series as well, which provide for an adjustable pulse width. It is possible to lay out several more NMOS transistors in advance without actually using all of them at any one time. The actual number used depends upon the the width of the desired pulse.

Referring to FIG. 18, the two input NAND gate X1 of FIG. 16 comprises P-channel transistors P1, P2, P3, P4, P5, and P6, in addition to N-channel transistors N1 and N2. The first input, coinciding from terminal P6 in FIG. 16, connects to the gates of transistors P1 and P3 and the gate of transistor N1. The substrate terminals of P1, P3 and P5 are connected to the supply voltage VCC*G, as are the substrate terminals of terminals P2, P4, and P6. The source of transistor P3 is connected to the supply voltage VCC*G and the drain of transistor P3 is connected to the source of transistor P1 and to the drain of transistor P5. The drain of transistor P1 is connected to the gate of transistor P5 and to the drain of transistor N1 and to the drain of transistor P2 and to the gate of transistor of P6 and to the output of the NAND device. The source of transistor P5 is connected to the supply voltage GND*G.

Likewise, the second input, coinciding from the terminal P5 in FIG. 16, connects to the gate of transistor N2 and to the gates of transistors P2 and P4. The source of transistor N1 is connected to the drain of transistor N2. The source of transistor N2 is connected to the supply voltage GND*G. The source of transistor P4 is connected to the supply voltage VCC*G. The drain of transistor P4 is connected to the source of the transistor P2 and the drain of transistor P6. The source of the transistor P6 is connected to the supply voltage GND*G, as are the substrate of transistors N1 and N2 connected to the supply voltage GND*G.

What is claimed is:

1. A one way hysteresis two input NAND gate comprising: in combination:
 a first pair of series connected P-channel transistors, each said transistor in said first pair having a gate, a source and a drain, the source of one transistor in said first pair being connected to the drain of the other transistor in said. first pair at a first series connection point;
 a second pair of series connected P-channel transistors, each said transistor in said second pair having a gate, a source and a drain, the source of one transistor in said second pair being connected to the drain of the other transistor in said second pair at a second series connection point;
 a third pair of series connected N-channel transistors, each said transistor in said third pair having a gate, a source and a drain, the source of one transistor in said third pair being connected to the drain of the other transistor in said third pair;
 said first and second pair of series connected transistors each having a previously unconnected drain connected to a previously unconnected drain of said third pair;
 a first and second and third terminal, said firs terminal being connected to the gates of said first pair and to the gate of one transistor in said third pair, said second terminal being connected to the gates of the transistors in said second pair and to the previously unconnected gate in said third pair;
 said third terminal comprising the connection point of a drain of said first pair, a drain of second pair and a drain of said third pair, said third terminal comprising the output of said NAND gate;
 a fourth pair of P-channel transistors each having a gate, a source and a drain, each said gate of said fourth pair is coupled to said third terminal, said source of each transistor is said fourth pair being coupled together, the drain of one transistor of said fourth pair is coupled to the connection point between the transistors of said first pair and the drain of the other of said forth pair is coupled to the connection point between the transistor in said second pair.

2. The NAND gate circuit, comprising:
 a first input terminal;
 a second input terminal;
 a first reference voltage source;
 a second reference voltage source;
 an output terminal;
 a first node;
 a second node;
 a third node;
 a first P-channel transistor with a gate connected to said first input terminal, a source connected to said first node, and a drain connected to said output terminal;
 a second P-channel transistor with a gate connected to said second input terminal, a source connected to said second node, and a drain connected to said output terminal;
 a third P-channel transistor with a gate connected to said first input terminal, a source connected to said first voltage source, and a drain connected to said first node;

a fourth P-channel transistor with a gate connected to said second input terminal, a source connected to said first reference voltage source, and a drain connected to said second node;

a fifth P-channel transistor with a gate connected to said output terminal, a source connected to said second reference voltage source, and a drain connected to said first node;

a sixth P-channel transistor with a gate connected to said output terminal, a source connected to said second reference voltage source, and a drain connected to said second node;

a first N-channel transistor with a gate connected to said first input terminal, a source connected to said third node, and a drain connected to said output terminal; and a second N-channel transistor with a gate connected to said second input terminal, a source connected to said second reference voltage source, a drain connected to said third node.

3. The NAND gate circuit, comprising:
a first input terminal;
a second input terminal;
a first reference voltage source;
a second reference voltage source;
an output terminal;
a first P-channel transistor with a gate connected to said first input terminal, a source, and a drain connected to said output terminal;
a second P-channel transistor with a gate connected to said second input terminal a source, and a drain connected to said output terminal;
a third P-channel transistor with a gate connected to said first input terminal, a source connected to said first voltage source, and a drain connected to source of said first P-channel transistor;
a fourth P-channel transistor with a gate connected to said second input terminal, a source connected to said first reference voltage source, and a drain connected to said source of said second P-channel transistor;
a fifth P-channel transistor with a gate connected to said output terminal, a source connected to said second reference voltage source, and a drain connected to said drain of said third P-channel transistor and to said source of said first P-channel transistor;
a sixth P-channel transistor with a gate connected to said output terminals a source connected to said second reference voltage source, and a drain connected to said source of said second P-channel transistor;
a first N-channel transistor with a gate connected to said first input terminal, a source, and a drain connected to said output terminal; and
a second N-channel transistor with a gate connected to said second input terminal, a source connected to said second reference voltage source, a drain connected to said source of said first N-channel transistor.

* * * * *